(12) United States Patent
Reddy et al.

(10) Patent No.: US 10,205,440 B2
(45) Date of Patent: Feb. 12, 2019

(54) RETENTION FLIP-FLOP CIRCUITS FOR LOW POWER APPLICATIONS

(71) Applicant: Synopsys, Inc., Mountain View, CA (US)

(72) Inventors: Basannagouda Somanath Reddy, Cupertino, CA (US); Deepak D. Sherlekar, Cupertino, CA (US); Princy K. Varghese, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/826,273

(22) Filed: Nov. 29, 2017

(65) Prior Publication Data

US 2018/0159513 A1     Jun. 7, 2018

Related U.S. Application Data

(60) Provisional application No. 62/428,745, filed on Dec. 1, 2016.

(51) Int. Cl.
| | | |
|---|---|---|
| *H03K 3/3562* | (2006.01) | |
| *H03K 3/012* | (2006.01) | |
| *H03K 3/356* | (2006.01) | |

(52) U.S. Cl.
CPC ......... *H03K 3/012* (2013.01); *H03K 3/35625* (2013.01); *H03K 3/356008* (2013.01)

(58) Field of Classification Search
CPC ............. H03K 3/012; H03K 3/356008; H03K 3/35625

USPC ........................................................ 327/203
See application file for complete search history.

(56) References Cited

U.S. PATENT DOCUMENTS

| | | | | |
|---|---|---|---|---|
| 7,603,634 | B2 * | 10/2009 | Sluss .................. | G06F 17/5068 716/138 |
| 9,348,770 | B1 * | 5/2016 | Lin ..................... | H03K 3/35625 |
| 2003/0188241 | A1 | 10/2003 | Zyuban et al. | |
| 2015/0084680 | A1 | 3/2015 | Cheng et al. | |

* cited by examiner

*Primary Examiner* — Patrick C Chen
(74) *Attorney, Agent, or Firm* — Bever, Hoffman & Harms, LLP

(57) ABSTRACT

Two retention flip-flop topologies that utilize a data retention control circuit and a slave/retention latch (sub-circuit) to reliably retain a data bit during standby/sleep operating modes without the need for a local clock signal. The slave/retention latch is controlled using a local clock signal to store sequentially received data bit values during normal operating modes. During standby/sleep modes, the local clock signal is de-activated (i.e., by turning off the supply voltage provided to the local clock generator circuit), and the data retention control circuit operates in accordance with an externally supplied retention enable control signal to both isolate and control the slave/retention latch such that a last-received data bit value is reliably retained in the slave/retention latch. When normal operation is resumed, the local clock signal is re-activated, and the data retention control circuit controls the slave/retention latch to pass the last-received data bit value to an output driver.

19 Claims, 6 Drawing Sheets

RETENTION FLIP-FLOP CIRCUITS FOR LOW POWER APPLICATIONS

RELATED APPLICATION

This application claims priority from U.S. Provisional Patent Application 62/428,745, entitled "RETENTION FLIP-FLOP CIRCUITS FOR LOW POWER APPLICATIONS", which was filed on Dec. 1, 2016, and is incorporated by reference herein.

FIELD OF THE INVENTION

The present invention relates to integrated circuits (ICs), and more particularly to improved volatile latch circuits for low power that efficiently retain data during standby/sleep operating modes.

RELATED ART

A retention flip-flop is a volatile latch circuit that is configured to operate in two or more modes of operation including a normal active mode and a standby or sleep mode (herein collectively referred to as a standby/sleep mode). All portions of the retention flip-flop receive power during normal active modes, and the retention flip-flop functions substantially the same as a normal flip-flop to receive and temporarily store data bits during logic operations performed by its host circuit. When the host circuit switches from the normal active mode into the standby/sleep mode, the retention flip-flop retains (stores) the last-received data bit value in way that facilitates switching off a main supply voltage (VDD) to selected portions of the retention flip-flop in order to conserve power during the standby/sleep mode, and that allows the last-received data bit value to be transmitted from the retention flip-flop's output terminal when the main supply voltage is switched back on (i.e., when the host circuit again switches from the standby/sleep mode back to the normal active mode). Specifically, a portion of the retention flip-flop utilizes a secondary (retention) supply voltage (e.g., VDDR or vbp) to remain active in order to retain the last-received data value while the main supply voltage is turned off during each standby/sleep mode (i.e., while other portions of the retention flip-flop are inactive), thereby facilitating both lower power consumption during standby/sleep modes, and also resumption of operations using last-received data values when normal operations are resumed. Ideally, the power consumed by a retention flip-flop during the standby/sleep mode (i.e., power required to retain the stored data bit) should be minimized, for example, in order to maximize the battery life of a mobile device.

Conventional retention flip-flops may include up to three latches that are used to store data bits at different stages of the clock and power cycle: a master latch, a slave latch, and a shadow slave (retention) latch. The master latch stores data received at the flip-flop's input, and may be turned-off during standby/sleep modes. The slave latch receives data from the master latch, and stores the data before being transmitted to an output driver—the slave latch may also be turned-off during standby/sleep modes. The retention latch copies and stores the last data bit stored on the slave latch prior to entering a standby/sleep mode, and transmits the last data bit to the output driver when the host circuit is subsequently "woken up" (i.e., transitions from standby/sleep to normal active mode). To retain data during standby/sleep modes, the retention latch is coupled to the retention supply voltage (e.g., VDDR or vbp). In contrast, the master and slave latches only receive power from the main supply voltage (VDD), which is turned off during standby/sleep modes.

There is a trend toward providing retention flip-flops that exhibit ever-lower power consumption during standby/sleep modes. An idealized retention flip-flop would theoretically consume zero power during standby/sleep modes, but in the practical world this ideal condition would require the use of a non-volatile memory device (e.g., an electrically erasable/programmable read only memory (EEPROM) cell), which are impractical for use in flip-flop circuits due to their long program/erase times. That is, retention flip-flops necessarily utilize volatile memory devices to provide sufficiently adequate flip-flop performance (i.e., sufficiently fast data transmission speeds). Of course, the use of volatile memory necessarily means that retention flip-flops must consume power during standby/sleep modes because volatile memory devices require an uninterrupted supply voltage in order to retain a stored data bit. Because host circuits that are periodically switched into a standby/sleep mode typically include large numbers of retention flip-flops, the total power consumed by all of the retention flip-flops during a retention (standby/sleep) mode can be significant. Therefore, there is a trend toward providing retention flip-flops that exhibit minimal power consumption.

Conventional retention flip-flops can be generally classified into two types referred to below as Topology A and Topology B.

FIG. 1 shows an exemplary retention flip-flop 50 based on Topology A. Retention flip-flop 50 includes a complex topology in which an input sampler 51, a master latch 52, a local clock 53, an output driver 59 and a portion of a slave latch 55 are disabled to minimize power consumption in the retention (standby/sleep) mode, but at the cost of area (i.e., this approach requires a large chip area to implement). Topology A uses a shadow slave latch 57 which shadows "normal" slave latch 55 using two control signals B1 and B2 (and their inverted forms B1N and B2N, respectively). In addition to requiring chip space, the shadow slave latch 57 also reduces performance (i.e., slows down the rate at which data may be transmitted through retention flip-flop 50 due to additional loading caused by shadow slave latch 57).

FIG. 2 shows an exemplary retention flip-flop 60 based on Topology B. Retention flip-flop 60 includes a simpler flip-flop topology including an input sampler 61, a master latch 62, a local clock 63, an output driver 69 and a slave latch 65. A local clock signal c generated by local clock signal generator 63 and a retention power-supply VSSR are utilized to retain a data bit in slave latch 65 during standby/sleep modes. Advantages of the Topography B approach over the Topography A approach include better performance (i.e., low switching time), and retention flip-flop 60 occupies a small chip area space than that required for retention flip-flop 50 due to the simplicity of its design. However, a problem with the Topography B approach is that it comes at the cost of high retention mode power consumption because local clock signal generator 63 must remain powered up during the standby/sleep mode.

What is needed is an improved volatile latch circuit (retention flip-flop) that achieves substantially lower standby/sleep mode power consumption in comparison to conventional flip-flop topologies having comparable or larger (chip area) sizes.

SUMMARY

The present invention is directed to volatile latch circuits (e.g., D-type retention flip-flops) including a data retention control circuit and a novel slave/retention latch (sub-circuit) that are controlled by a single externally supplied retention enable control signal to reliably retain last-received logic (data bit) values during standby/sleep operating modes. The data retention control circuit includes a retention transfer gate coupled between a master latch (sub-circuit) and the slave/retention latch, and an optional retention enabler circuit that functions to generate an inverted form of the retention enable control signal. The slave/retention latch is controlled by a local clock signal to latch sequentially received logic (data bit) values passed along an associated signal path from the master latch. During normal active modes, the retention transfer gate remains turned-on to pass logic values from the master latch to the slave/retention latch, and the slave/retention latch is controlled by a local clock signal to latch the sequentially received logic (data bit) values and pass them by way of an output driver onto the associated signal path. Immediately before entering a subsequent standby/sleep mode, the retention enable control signal is asserted, thereby turning off the retention transfer gate to isolate the slave/retention latch from the master latch after a last-received logic value has been latched in the slave/retention latch. The subsequent standby/sleep mode is then entered by way of turning off a main (first) voltage supply, thereby de-activating, e.g., the master latch, the output driver, and a local clock generation circuit. During the subsequent standby/sleep mode, the slave/retention latch retains the last-received logic value using a retention (second) supply voltage and the asserted retention enable control signal. When the flip-flop switches back to normal active mode operations, the main supply voltage is activated, and then the retention enable control signal is de-asserted in order to pass the last-received logic value to the output driver, thereby allowing the flip-flop to "wake up" with the same data present when standby/sleep mode was initiated. By utilizing a slave/retention latch that is powered using the retention (second) supply voltage and is controlled by the external retention enable control signal to retain a last-received logic (data bit) value during standby/sleep modes, the present invention achieves both a small-chip-area benefit similar to that of Topology B conventional approaches (described above), and also substantially reduced power consumption over both Topology A and Topology B approaches by way of enabling de-activation of the local clock generation circuit.

According to a generalized practical embodiment, one or more volatile latch circuits of the present invention are implemented on an IC that is fabricated on a semiconductor substrate using known fabrication techniques. In particular, the one or more volatile latch circuits and at least one local clock generator circuit are disposed in a power domain sub-circuit of the IC, where the power domain sub-circuit is configured to selectively operate either in a normal active mode or in a standby/sleep mode in accordance with control and power signals generated by a mode control circuit, which is also fabricated on the semiconductor substrate. In an exemplary embodiment, the mode control circuit is configured to generate/transmit a main (first) supply voltage to the power domain sub-circuit and to de-assert a retention enable control signal during each normal active mode, and configured to de-activate the main supply voltage and to assert/transmit the retention enable control signal to the power domain sub-circuit during each standby/sleep mode. Similar to conventional retention flip-flops, each volatile latch circuit is configured to sequentially latch logic (data bit) values passed on its associated signal path during each normal active mode, to retain (store) a last-received logic value passed to the volatile latch circuit when the power domain sub-circuit is switched from the normal active mode to the standby/sleep mode, and to output the last-received logic value when the power domain sub-circuit is subsequently switched back from the standby/sleep mode to the normal active mode.

In at least one embodiment of the present invention, the data retention control circuit of the is powered by the main supply voltage and includes a retention enabler sub-circuit and a retention transfer gate. The retention enabler sub-circuit includes an inverter that is coupled to the main (first) supply voltage, and configured to assert an inverted retention control signal while the retention control signal is de-asserted (i.e., such that the inverted retention control signal has a high voltage level while the retention control signal has a low voltage level during the normal active mode). The retention control signal and the inverted retention control signal are respectively applied to applied to PMOS and NMOS transistors that form the retention transfer gate, whereby the retention transfer gate remains fully turned on during the normal active modes (i.e., when the retention control signal is de-asserted/low and the inverted retention control signal is asserted/high), and the retention transfer gate remains fully turned off during the standby/sleep modes (i.e., when the retention control signal is asserted/high and the inverted retention control signal is de-asserted/low). With this arrangement, the data retention control circuit is not part of the critical path passing through the retention flip-flop, and hence does not affect performance of the retention flip-flop.

According to a Topology C embodiment of the present invention the slave/retention latch is coupled between the master latch and an output driver such that the associated signal path passes through the slave/retention latch, and in accordance with a Topology D embodiment the output driver is connected in parallel with the slave/retention latch such that, during normal operations logic values pass from the master latch directly to the output driver. The Topology C configuration achieves the benefits of having a small size and the power-saving feature achieved by being able to turn off the local clock generating circuit. The Topology D configuration achieves similar benefits to the Topology C configuration, and in addition achieves faster clock-to-output performance by way of moving the slave/retention latch out of the critical path. In addition, the two cross-coupled inverters forming the slave/retention latch utilized in the Topology D configuration may be implemented using relatively small NMOS and PMOS transistors because the slave/retention latch out of the critical path.

The present invention will be more fully understood in view of the following description and drawings.

DETAILED DESCRIPTION

Figure 1:
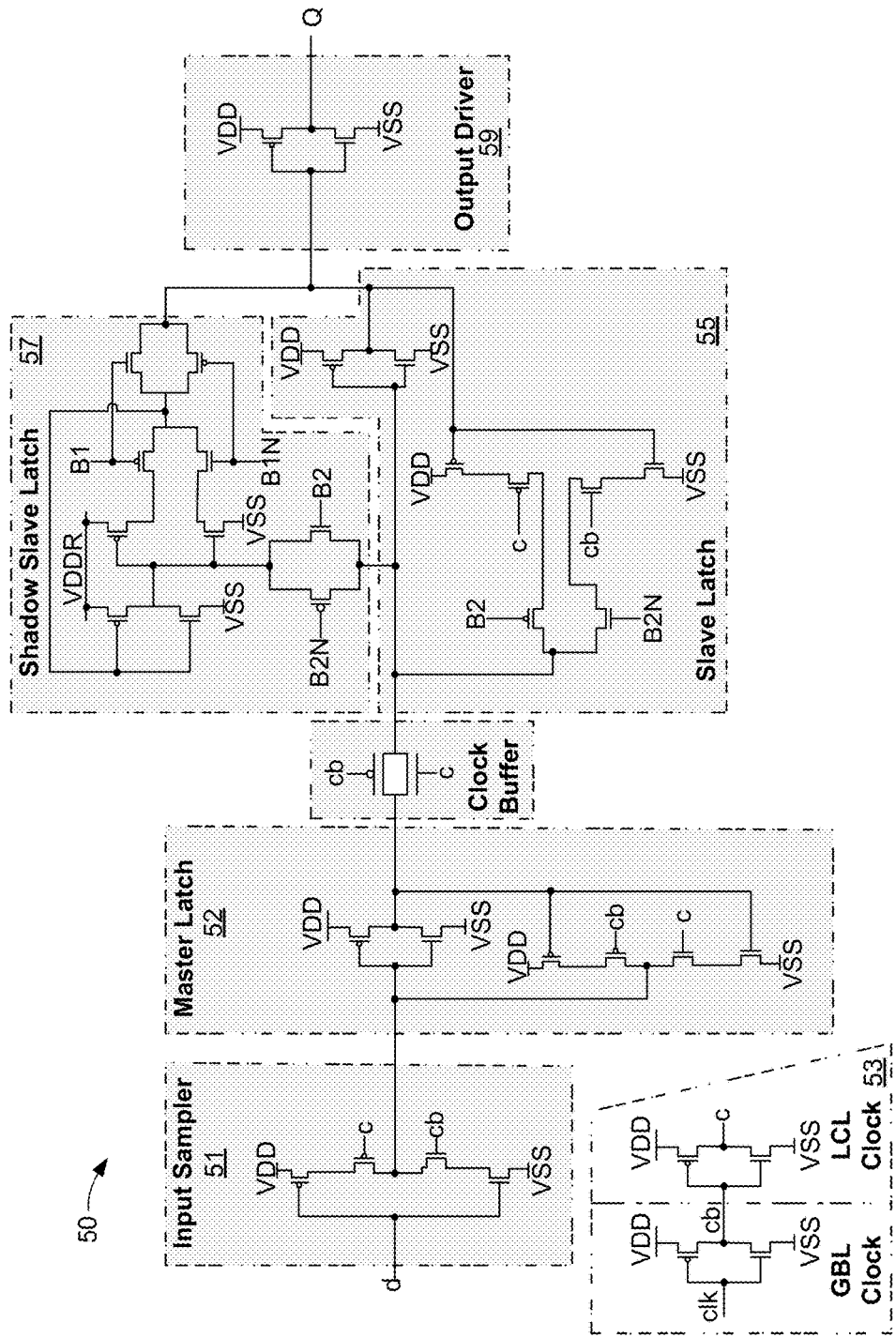
FIG. 1 is a circuit diagram showing a retention flip-flop configured in accordance with a first conventional topology.
Figure 2:
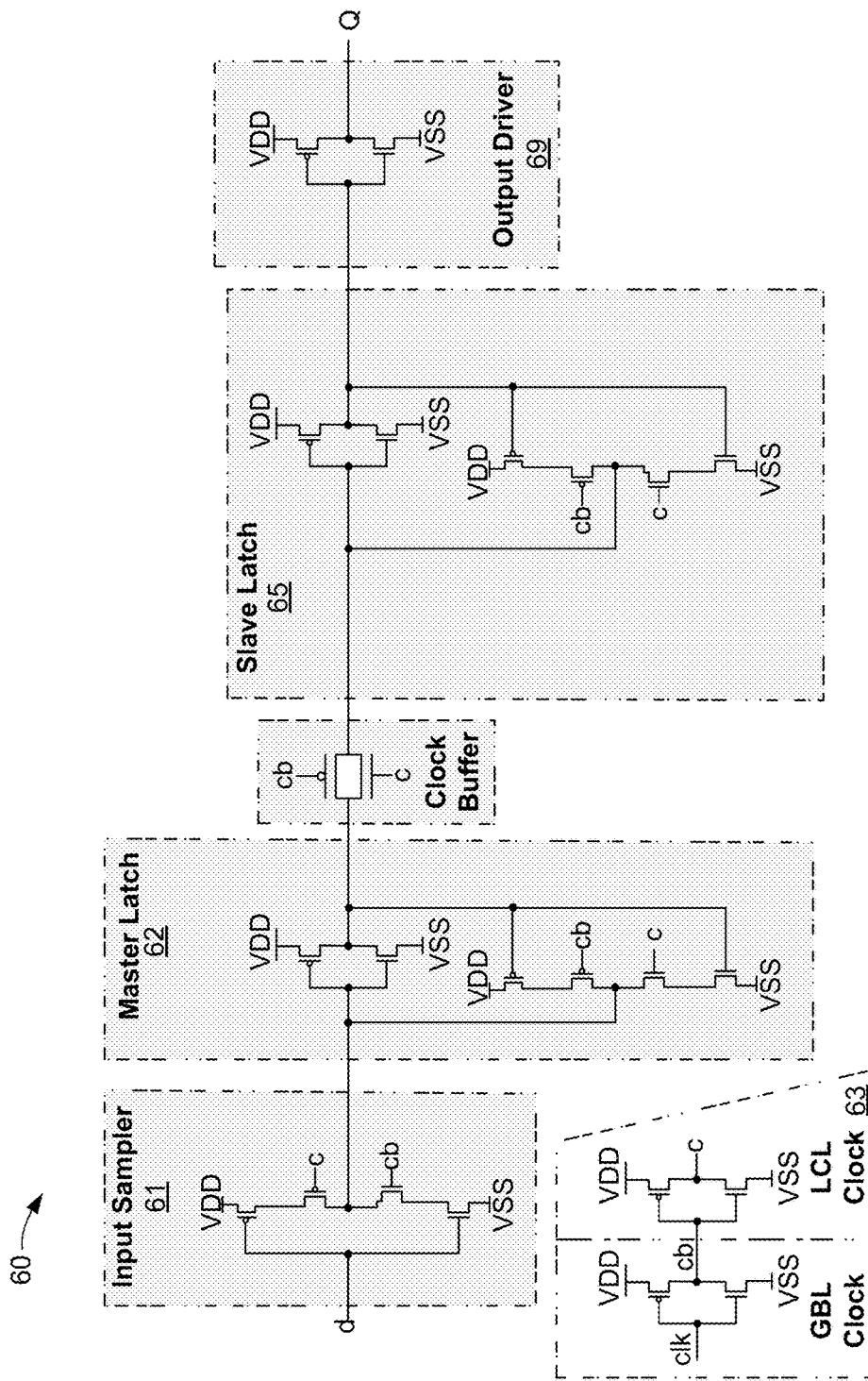
FIG. 2 is a circuit diagram showing another retention flip-flop configured in accordance with a second conventional topology.

The present invention relates to an improvement in volatile latch circuits, such as D-type retention flip-flops. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments.

Therefore, the present invention is not intended to be limited to the particular embodiments shown and described, but is to be accorded the widest scope consistent with the principles and novel features herein disclosed.

As established in the background section (above), volatile latch circuits (e.g., retention flip-flops) are often utilized in System-On-Chip (SoC) devices and other ICs that are developed for low power applications (e.g., cell phones and laptop computers, where low power consumption is desirable to prolong device operation for each battery charge). Such ICs typically include two or more power domains (sub-circuits), where each power domain is driven by a unique combination of associated supply voltages that are transmitted by way of respective metal traces. This arrangement facilitates selectively switching one or more of the power domains from a high-power-consumption normal active operating mode to a low-power-consumption standby/sleep operating mode by way of controlling the supply voltages according to a pre-defined power specification. Techniques utilized to selectively activate and de-activate one or more supply voltages in order to switch a given power domain between active normal and standby/sleep operating modes are well known in the art, and therefore volatile latch circuits configured in accordance with the present invention may be utilized on any IC implementing two or more power domains.

Although the known supply voltage control techniques may be used to selectively transmit any number of supply voltages to each power domain, the configuration and operation of volatile latch circuits of the present invention are described below with specific reference to only three supply voltages: a main (first) supply voltage identified using "VDD" for reference, a retention (second) supply voltage that is identified using "VDDR" for reference, and a ground (third) voltage that is identified using "VSS". Main supply voltage VDD is transmitted on a first power trace from a mode (power) control circuit to first portions of a given volatile latch, and is switched between an active (turned-on) state having a first positive voltage level during each normal active operating mode, and a de-active (turned-off, e.g., 0V) state during each standby/sleep operating mode. Retention supply voltage VDDR is transmitted on a second power trace to second portions of each given volatile latch circuit, and is maintained at a second voltage level, which may be equal to the first voltage level, during both standby/sleep and normal active operating modes. Ground supply voltage VSS is transmitted to the given volatile latch circuit by way of an associated third power trace, and is also maintained at a constant low voltage level (e.g., 0V) during both standby and normal active modes.

The volatile latch circuit of the present invention is described herein with reference to two exemplary D flip-flop circuits having associated topologies: a first D flip-flop 100A, which is shown and described below with reference to FIG. 3, implements a first topology that is generally referred to herein as "Topology C"; a second flip-flop 100B, which is shown and described below with reference to FIG. 4, implements a second topology that is generally referred to herein as "Topology D". That is, D flip-flop 100A represents a specific embodiment implementing the attributes of Topology C that are mentioned below, and D flip-flop 100B represents a specific embodiment implementing the attributes of Topology D. Certain novel characteristics of the present invention are implemented in both Topologies C and D, and volatile latch circuits implementing the spirit and scope of the present invention may be implemented using circuit elements and configurations that differ from those described below with specific reference to FIGS. 3 and 4. Accordingly, the appended claims are intended to be limited by the specific elements and configurations of exemplary D flip-flops 100A and 100B unless specified in the associated claim language.

Figure 3:
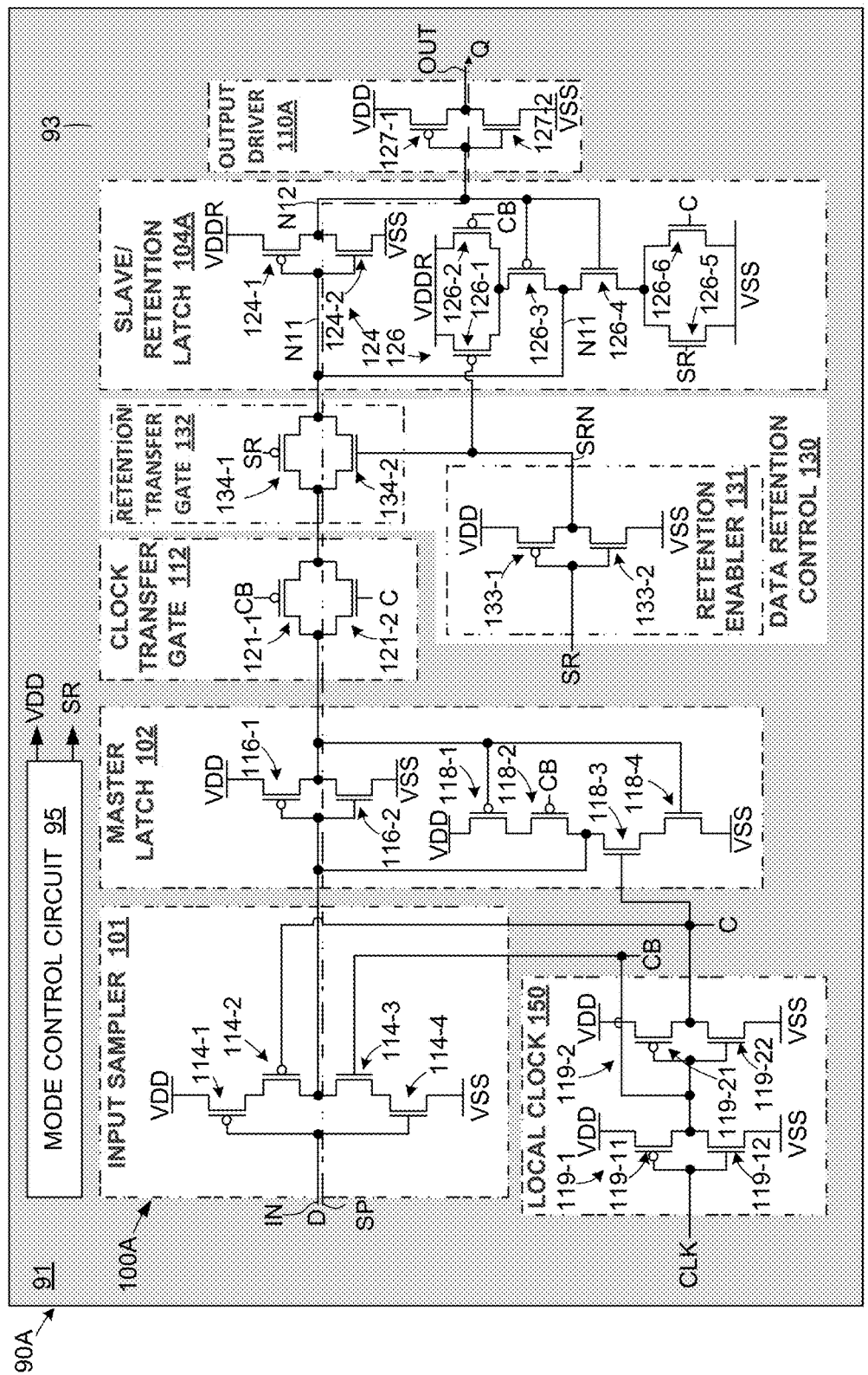
FIG. 3 is a circuit diagram showing a partial IC including a retention flip-flop configured in accordance with a first exemplary embodiment of the present invention.

FIG. 3 shows a simplified IC 90A that is fabricated on a semiconductor substrate 91A using known semiconductor processing (e.g., CMOS) techniques, and generally includes a mode control circuit 95 and a power domain sub-circuit 93 including a D-type retention flip-flop (volatile latch circuit) 100A and a local clock generator circuit 150.

Figure 5A:
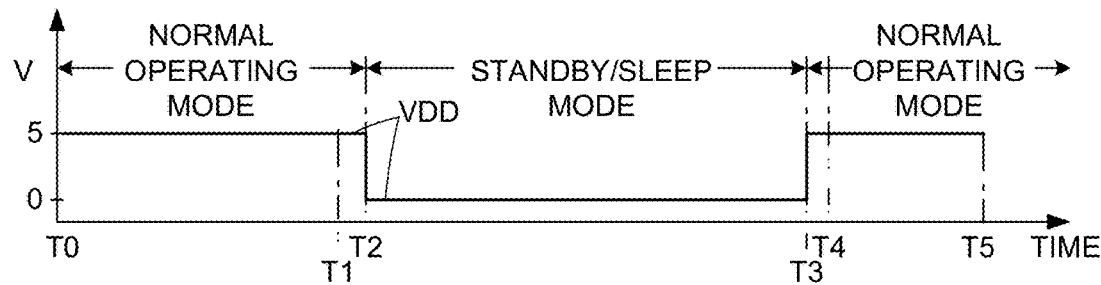
FIGS. 5(A) and 5(B) are waveform diagrams illustrating operating voltages supplied to the retention flip-flop of FIG. 3 in accordance with one embodiment of the present invention.
Figure 5B:
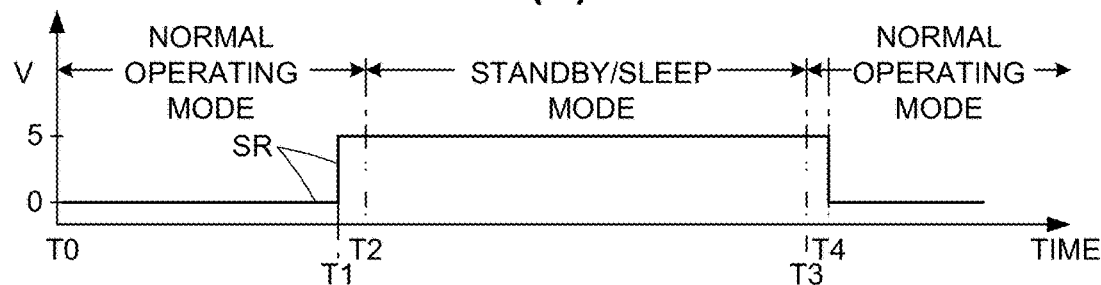

Referring to the upper portion of FIG. 3, mode control circuit 95 is configured to transmit a main (first) supply voltage VDD to power domain sub-circuit 93 and to de-assert a retention enable control signal SR during normal active modes, and is configured to de-activate main supply voltage VDD and assert/transmit retention enable control signal SR during standby/sleep modes. In one embodiment, mode control circuit 95 implements at least a portion of a power management circuit of IC 90A that selectively controls the operating state of power domain sub-circuit 93 in the manner described below, and optionally to also control the operating state of other power domains of IC 90A, which are omitted for clarity and brevity. In the exemplary embodiment, mode control circuit 95 is configured to control the activation and de-activation of main supply voltage VDD and retention enable control signal SR according to the simplified waveform diagrams depicted in FIGS. 5(A) and 5(B), respectively. Referring to FIG. 5(A), mode control circuit 95 is configured using known techniques to assert (activate) main supply voltage VDD during normal active mode operating time periods T0 to T2 and T3 to T5, and to de-assert (de-activate) main supply voltage VDD during each intervening standby/sleep mode operating period T2 to T3. Referring to FIG. 5(B), mode control circuit 95 is further configured using known techniques to assert retention enable control signal SR at a time T1 (i.e., prior to the beginning of the standby/sleep mode), and to de-assert retention enable control signal SR at a time T4 (immediately after the end of each normal active mode). The voltage values shown in FIGS. 5(A) and 5(B) are exemplary.

Referring to a lower portion of FIG. 3, local clock generator circuit 150 is configured to generate local clock signal C and inverted local clock signal CB is response to a global clock signal CLK that is generated on or supplied to IC 90A according to known techniques. Local clock signal C and inverted clock signal CB are utilized to control various sub-circuits of flip-flop 100A in the manner described below, and are optionally used by other related circuitry (e.g., other retention flip-flops, not shown) that may be disposed in power domain 93. In the exemplary embodiment, local clock sub-circuit 150 includes two inverters 119-1 and 119-2 respectively including transistors 119-11 and 119-12 and transistors 119-21 and 119-22. The source terminals of the PMOS transistors 119-11 and 119-21 are connected to main supply voltage VDD, and the source terminals of the NMOS transistors 119-12 and 119-22 are connected to the ground/VSS potential. With this arrangement, local clock sub-circuit 150 generates two conditioned output signals in response to global clock signal CLK during normal active modes (i.e., while main supply voltage VDD is available): buffered and conditioned clock timing signal C, and inverted and conditioned clock timing signal CB (i.e., C-bar). In one embodiment, local clock sub-circuit 150 utilizes known techniques to condition the leading and lagging edges of the clock signal and/or alter the interval of the clock signal within the depicted circuit arrangement. In alternative embodiments other local clock generator arrangements may be utilized (e.g., retention flip-flop 100A may be reconfigured to operate solely using conditioned local clock signal C).

Referring to the central portion of FIG. 3, flip-flop 100A includes an optional input sampler sub-circuit 101, a master latch sub-circuit 102, a clock transfer gate 112, data region control circuit 130, a slave/retention latch 104A, and an output driver sub-circuit 110A.

Figure 6:
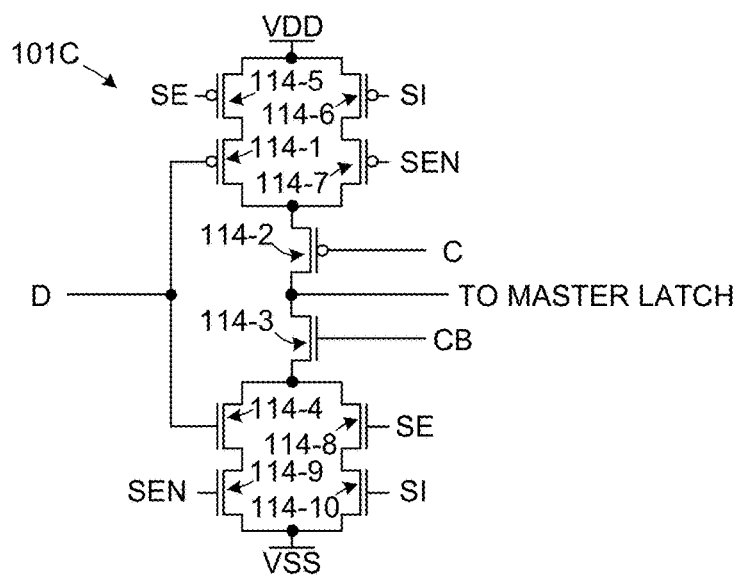
FIG. 6 is a circuit diagram showing an input sampler circuit utilized in the retention flip-flop of FIG. 3 in accordance with an alternative embodiment of the present invention.

Input sampler sub-circuit 101 is connected between flip-flop input terminal (node) IN and master latch sub-circuit 102, functions both to sequentially select/receive input logic (data bit) signals D applied to input terminal IN, and to transmit each sequentially selected logic value to a master latch 102 at a sampling level set by local clock signal C. In alternative specific embodiments, input sampler circuit 101 can be an inverter (e.g., as shown in FIGS. 3 and 4), or a scan-enable-multiplexer (e.g., as indicated by circuit 101C shown in FIG. 6), as well as other types of circuits along with a clock-enabled sampler that transfers the input data as long as some power is applied to this circuit. In the embodiment of FIG. 3, input sampler circuit 101 includes an inverter is formed by series-connected transistors 114-1 to 114-4 that are coupled between main supply voltage VDD and ground VSS, whereby during active normal modes the inverter samples input data (logic values) D applied to input terminal IN from outside based on local clock signal C and inverted clock signal CB. At the non-sampling level, input sampler 101 isolates (shuts off) master latch 102 from input terminal IN. In contrast, input sampler circuit 101C (FIG. 6) includes additional transistors 114-5 to 114-10 that facilitate a scan testing capability enabled by assertion of a scan enable signal SE (and its inverse SEN). Input sampler 101C receives, in addition to the data input D, a scan input signal (named SI) and scan enabler signal (named SE) which selects between either data input D or scan input SI. Regardless of the type of the input sampler 101C selects, it passes on the data input sampled to the master latch when sampling is enabled. Transistors 114-2 and 114-3 act as the sampler since they receive clock signals C and CB. The source terminal of the lead pull-up PMOS transistors 114-5 and 114-6 are connected to main supply voltage VDD (e.g., 5V, 3.3V or 1V). The source terminals of bottom NMOS transistors 114-9 and 114-10 are connected to ground (third) voltage supply VSS (e.g., 0V).

Referring again to FIG. 3, master latch sub-circuit 102 is configured to receive sequential logic values from input sampler 101 during first cycle of local clock signal C, and to pass the sequential logic value to slave/retention latch sub-circuit 104A during second cycles of local clock signal C. In one embodiment, master latch sub-circuit 102 includes two sets of transistors 116-1 and 116-2 and 118-1 to 118-4 that are operably configured to store each received data value during intervening periods when input sampler 101 does not pass new data to master latch 102. The source terminals of PMOS transistors 116-1 and 118-1 are connected to main voltage supply VDD, and the source terminals of NMOS transistors 116-2 and 118-4 are connected to ground/VSS. With this arrangement, a logic value passed to master latch 102 from input sampler 101 causes Clock transfer gate 112 is coupled in the signal path between master latch sub-circuit 112 and slave/retention latch sub-circuit 104A, and functions as a transmission gate to pass logic values from master latch sub-circuit 112 and slave/retention latch sub-circuit 104A in accordance with local clock signal C. In the exemplary embodiment, clock transfer gate 112 includes parallel-connected PMOS transistor 121-1 and NMOS transistor 121-2 that are respectively controlled by local clock signals CB and C. When local clock sub-circuit 150 is enabled, clock transfer gate 112 is controlled by clock signals C and CB to transfer the stored data in master latch 102 to slave/retention latch sub-circuit 104, whereby the data is subsequently passed to output driver 110A by way of retention transfer gate sub-circuit 132 (discussed below) and slave/retention latch sub-circuit 104A.

Data retention control circuit 130 includes a data retention enabler sub-circuit 131 and a retention transfer gate 132.

Retention enabler 131 receives a retention enable signal SR from an associated control circuit (e.g., from mode control circuit 95), and generates an inverted retention enable signal SRN that is supplied to other parts of flip-flop 100A for use in storing data before switching to standby/sleep mode. Retention enabler sub-circuit 131 includes one set of transistors 133-1 and 133-2, wherein the source terminal of the pull-up PMOS transistor 133-1 is connected to the main supply voltage VDD, and the source terminal of the pull-down NMOS transistor 133-2 is connected to the VSS voltage potential. During normal active modes retention control signal SR is de-asserted (0V), whereby retention enabler sub-circuit 131 generates inverted retention control signal SRN as a high (e.g., 5V) signal. During standby/sleep modes, retention control signal SR is asserted (e.g., 5V), but retention enabler sub-circuit 131 is de-activated by way of shutting off main supply voltage VDD, whereby inverted retention control signal SRN is 0V—in this way, retention enabler sub-circuit remains functional during standby/sleep modes to accurately generate inverted retention control signal SRN. Retention enabler sub-circuit 131 thus supplies retention control signals SR and SRN to retention transfer gate sub-circuit 132 and to the slave/retention latch sub-circuit 104A during all operating modes.

Retention transfer gate 132 functions to transfer data from the master latch 102 to slave/retention latch 104A during normal active modes, and to help retain data on slave/retention latch 104A during standby/sleep modes in response to retention enable signals SR and SRN received form retention enabler 131. Retention transfer gate 132 is thereby turned on by retention control signals SR and SRN to pass data values between master latch 102 and slave/retention latch 104A (by way of clock transfer gate 112) during normal active modes, and turned off by retention control signals SR and SRN to isolate the slave/retention latch sub-circuit 104A from the rest of D flip-flop 100A during standby/sleep modes. Note that retention control signals SR and SRN are utilized to control portions of slave/retention latch sub-circuit 104A, as described below.

Slave/retention latch 104A performs two functions. During normal active operating modes, non-volatile sub-circuit 104A functions to receive and temporarily store logic value from master latch 102 (i.e., by way of clock transfer gate 112 and retention transfer gate 132), and to pass logic (data bit) values to output driver 110A. During sleep/standby operating modes, non-volatile sub-circuit 104A functions to store (retain) a last-received logic value, and then to transmit the last-received logic value to output driver 110A at the beginning of the next normal operating mode. In the disclosed embodiment, slave/retention latch 104A includes two cross-coupled inverters: a first inverter 124 coupled between an input node N11 and an output node N12, and a second inverter 126 coupled between output node N12 and input node N11. First inverter 124 is configured as a simple inverter that receives logic values passed from master latch 102 (i.e., by way of clock transfer gate 112 and retention transfer gate 132), and generates a corresponding inverted logic value on output node N12. Second inverter 126 is configured as a clocked inverter that receives an inverted logic value generated by first inverter 124 during each cycle of local clock signal C, and generates a corresponding re-inverted logic value on input node N11 that is applied to the input of first inverter 124. The inverted logic value generated by first inverter 124 on output node N12 is also passed to output driver 110A. In one embodiment, first inverter 124 includes a pull-up PMOS transistor 124-1 and a pull-down NMOS transistor 124-2 that are connected in series between retention (second) supply voltage VDDR (e.g., 5V) and ground/VSS, with the gate terminals of transistors 124-1 and 124-2 connected to input node N11 (i.e., to an input terminal of inverter 124), and output node N12 connected between the drain terminals of transistors 124-1 and 124-2. Second inverter 126 includes pull-up PMOS transistors 126-1, 126-2 and 126-3 and pull-down NMOS transistors 126-4, 126-5 and 126-6. PMOS transistors 126-1 and 126-2 are connected in parallel between retention supply voltage VDDR (e.g., 5V) and (third) PMOS transistor 126-3, with PMOS transistor 126-1 controlled by inverted retention enable control signal SRB, and PMOS transistor 126-2 controlled by inverted local clock signal CB. NMOS transistors 126-5 and 126-6 are connected in parallel between VSS and NMOS transistor 126-4, with NMOS transistor 126-5 controlled by retention enable control signal SR, and NMOS transistor 126-6 controlled by local clock signal C. The gates of PMOS transistor 126-3 and NMOS transistor 126-4 are connected to output node N12 (i.e., the output terminal of inverter 124). With this arrangement, in combination with the configuration of data retention control circuit 130, during normal active modes, (first) PMOS transistor 126-1 and (first) NMOS transistor 126-5 remain turned off by way of de-asserted retention enable control signal SR and asserted inverted retention enable control signal SRN, which is generated by retention enabler circuit 131, and second inverter 126 is controlled by local clock signal C applied to (second) PMOS transistor 126-2 and inverted clock signal CB applied to (second) NMOS transistor 126-6 to reinvert the inverted logic value applied to the gate terminals of (third) PMOS transistor 126-3 and (third) NMOS transistor 126-4. Conversely, during standby/sleep modes, (first) PMOS transistor 126-1 and (first) NMOS transistor 126-5 remain turned on by way of asserted retention enable control signal SR and de-asserted inverted retention enable control signal SRN to continuously reinvert the inverted last-received logic value applied to the gate terminals of (third) PMOS transistor 126-3 and (third) NMOS transistor 126-4.

Output driver sub-circuit 110A has an input terminal connected to an output terminal of slave/retention latch sub-circuit 104A such that slave/retention latch sub-circuit 104A is coupled between master latch sub-circuit 102 and output driver 110A. Output driver 110A is implemented by a PMOS transistor 127-1 and an NMOS transistor 127-2, where the source terminal of the PMOS transistor 127-1 is connected to main supply voltage VDD, and the source terminal of the NMOS transistor 127-2 is connected to the ground/VSS voltage potential. Output driver 110A is formed as an inverter that inverts logic (data bit) values received from slave/retention latch sub-circuit 104A, and generates flip-flop output value Q on an output terminal that is connected, for example, to a system bus (not shown), and is configured to communicate (transmit) output value Q by way of flip-flop output node OUT to other portions (not shown) of integrated circuit 90A.

The operation of retention flip-flop 100A is now described with reference to FIGS. 3A to 3F, which include simplified block diagrams representing relevant circuit structures of IC 90A (FIG. 3). In these figures, de-asserted voltages/signals are indicated by being x-ed out. For example, in FIG. 3A, retention enable control signal SR is indicated as being de-asserted (e.g., 0V) by way of being x-ed out, while main supply voltage VDD, retention supply voltage VDDR and inverted retention enable control signal SRB are indicated as being asserted (high, e.g., 5V). Conversely, as indicated in FIG. 3D, retention enable control signal SR is indicated as being asserted (e.g., 5V) by way of not being x-ed out, while main supply voltage VDD, and inverted retention enable control signal SRB are indicated as being de-asserted (low, e.g., 0V) by way of being x-ed out.

Figure 3A:
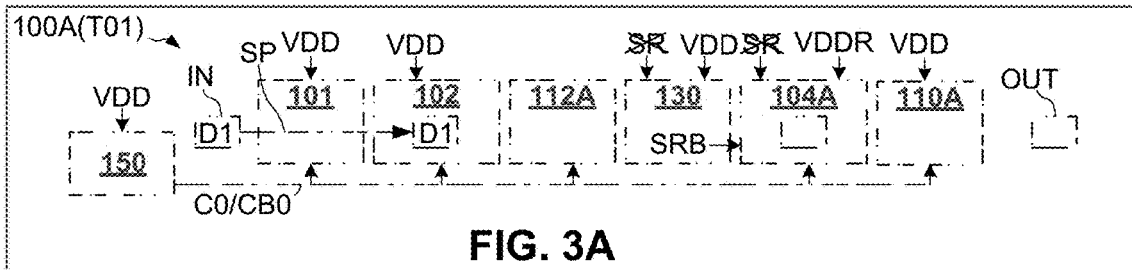
FIGS. 3A, 3B, 3C, 3D, 3E and 3F are simplified block diagrams depicting exemplary operating states of the retention flip-flop of FIG. 3 during operation.
Figure 3B:
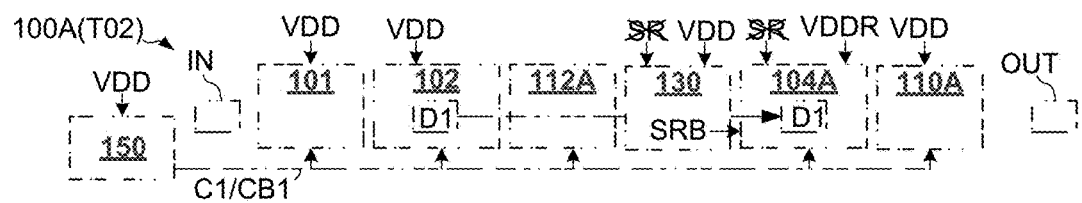
Figure 3C:
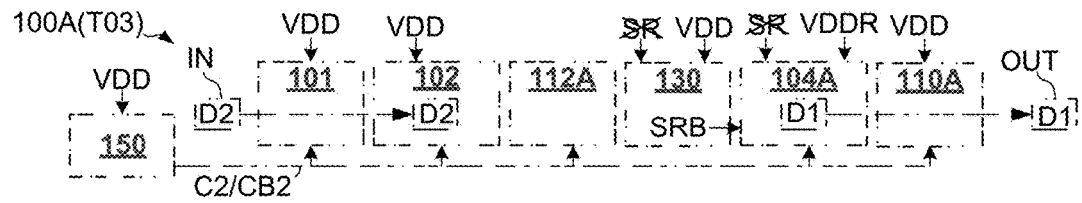

FIGS. 3A to 3C depict exemplary operating states of retention flip-flop 100A during normal active mode operations. FIG. 3A shows flip-flop 100A at an initial time T01 while main voltage supply VDD is asserted and retention enable control signal SR is de-asserted. Note that main supply voltage VDD is supplied to input sampler 101, master latch 102, retention control circuit 130, output driver 110A and local clock generator 150, which generates local clock signal C and inverted local clock signal CB. Note also that retention supply voltage VDDR is also active and supplied to slave/retention latch 104A. Accordingly, during normal active mode, all sub-circuits of retention flip-flop 100A are active and consuming power. According to the simplified example, at time T01 (FIG. 3A) a logic value D1 passed along signal path SP to input node IN, and is passed by way of input sampler 101 to master latch 102 during a first cycle of local clock C/CB (indicated by "C0/CB0"). At a subsequent time T02 (FIG. 3B) during the normal active mode, logic value D1 is passed by way of clock transfer gate 112 from master latch 102 to slave/retention latch 104A during a second (subsequent) cycle of local clock C/CB (indicated by "C1/CB1"). Referring to FIG. 3, at this time state slave/retention latch 104A is controlled to receive and temporarily store logic value D1 by way of controlling pull-up PMOS transistor 126-2 and pull-down NMOS transistor 126-6 using local clock signal C and inverted local clock signal CB, respectively. Referring to FIG. 3C, at a subsequent time T03, logic value D1 is transmitted by way of output driver 110A from slave/retention latch 104A to output node OUT while a second logic value D2 is passed from input node IN to master latch 102 by way of input sampler 101 during a subsequent cycle of local clock C/CB (indicated by "C2/CB2"). In this manner, retention flip-flop 100A functions in a manner similar to standard flip-flop circuits during normal active modes to latch sequentially transmitted logic values in master latch 102 during first cycles of local clock signal C and CB, and to pass/latch the sequential logic values by way of clock transfer gate 112 (and retention transfer gate 132) to/in slave/retention latch sub-circuit 104A during second cycles of local clock signal C and CB.

Figure 3D:
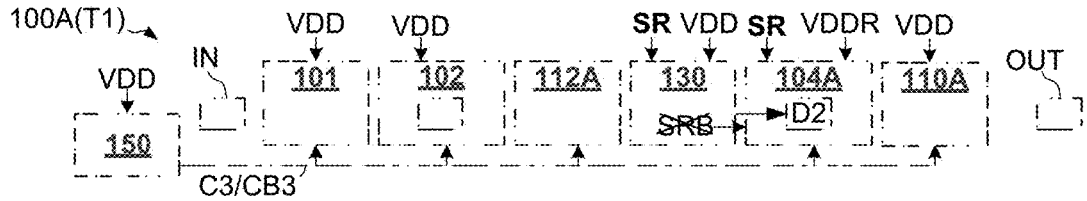
Figure 3E:
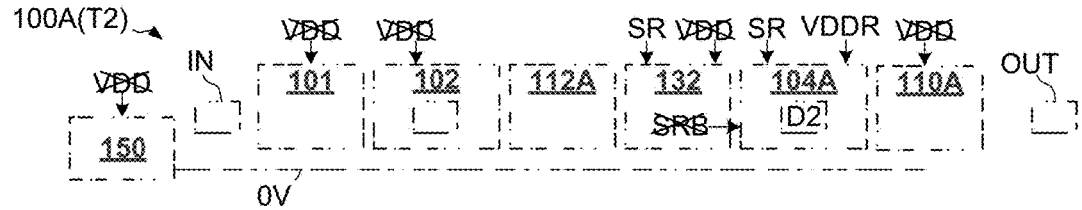

FIGS. 3D and 3E depict retention flip-flop 100A during the transition from normal active mode to a subsequent standby/sleep mode (e.g., corresponding to times T1 and T2 referenced in FIGS. 5(A) and 5(B), discussed above). FIG. 3D shows retention flip-flop 100A at time T1, when retention enable control signal SR is asserted immediately before entering the standby/sleep mode. Assertion of retention enable control signal SR while main supply voltage VDD is still active causes retention control circuit 130 to turn off retention transfer gate 132 (shown in FIG. 3) after last-received logic value D2 has been latched in slave/retention latch 104A, thereby isolating slave/retention latch 104A from master latch 102 during the standby/sleep mode. FIG. 3E depicts the operating states of retention flip-flop 100A at time T1, wherein the subsequent standby/sleep mode is entered by way of turning off main (first) voltage supply VDD, thereby de-activating input sampler 101, master latch 102, data control retention circuit 130, output driver 110A, and local clock generation circuit 150. Note that powering down local clock generation circuit 150 results in the termination of local clock signal C/CB, which is indicated by "C/CB=0V" in FIG. 3E. Note also that powering down data control retention circuit 130 results in the de-assertion of inverted retention enable control signal SRB. Referring to FIG. 3, in this way state slave/retention latch 104A is enabled to retain the last-received logic value (i.e., value D2) because both inverters 124 and 126 remain active by way of respectively being coupled between retention supply voltage VDDR and ground/VSS, and because pull-up PMOS transistor 126-1 remains turned on by de-asserted inverted retention enable control signal SRB, and pull-down NMOS transistor 126-5 remains turned on by asserted retention enable control signal SR. Retention flip-flop 100A thus remains in the operating state depicted in FIG. 3E during the entire standby/sleep mode period, whereby last-received logic value D2 is reliably retained in slave/retention latch 104A.

Figure 3F:
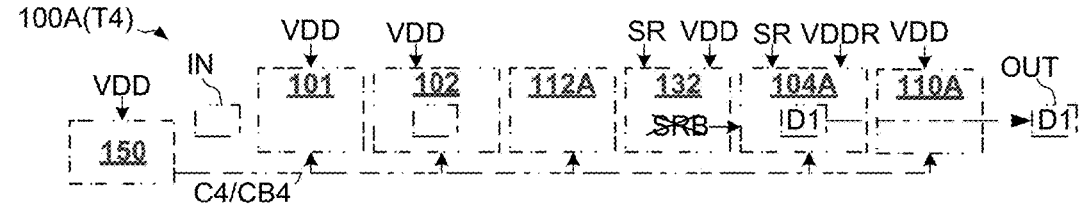

FIG. 3F depicts the operating states of retention flip-flop 100A at time T3, corresponding to the transition from the standby/sleep mode depicted in FIG. 3E to a subsequent normal active mode, where time T3 corresponds to the re-assertion of main supply voltage VDD (i.e., prior to the de-assertion of retention enable control signal SR) as described above with reference to FIGS. 5(A) and 5(B). The re-assertion of main supply voltage VDD turns on the various sub-circuits of retention flip-flop 100A, and in particular activates output driver 110A, whereby last-received logic value D2 is passed from slave/retention latch 104A to output node OUT. Note that retention enable control signal SR remains asserted for a short time in order to maintain the isolation of slave/retention latch 104A (i.e., by way of maintaining retention transfer gate 132 in a turned-off (open-circuit) state). Subsequent to the operating state shown in FIG. 3F, retention enable control signal SR is de-asserted, and the subsequent normal active mode operation proceeds as described above with reference to FIGS. 3A to 3C.

Figure 4:
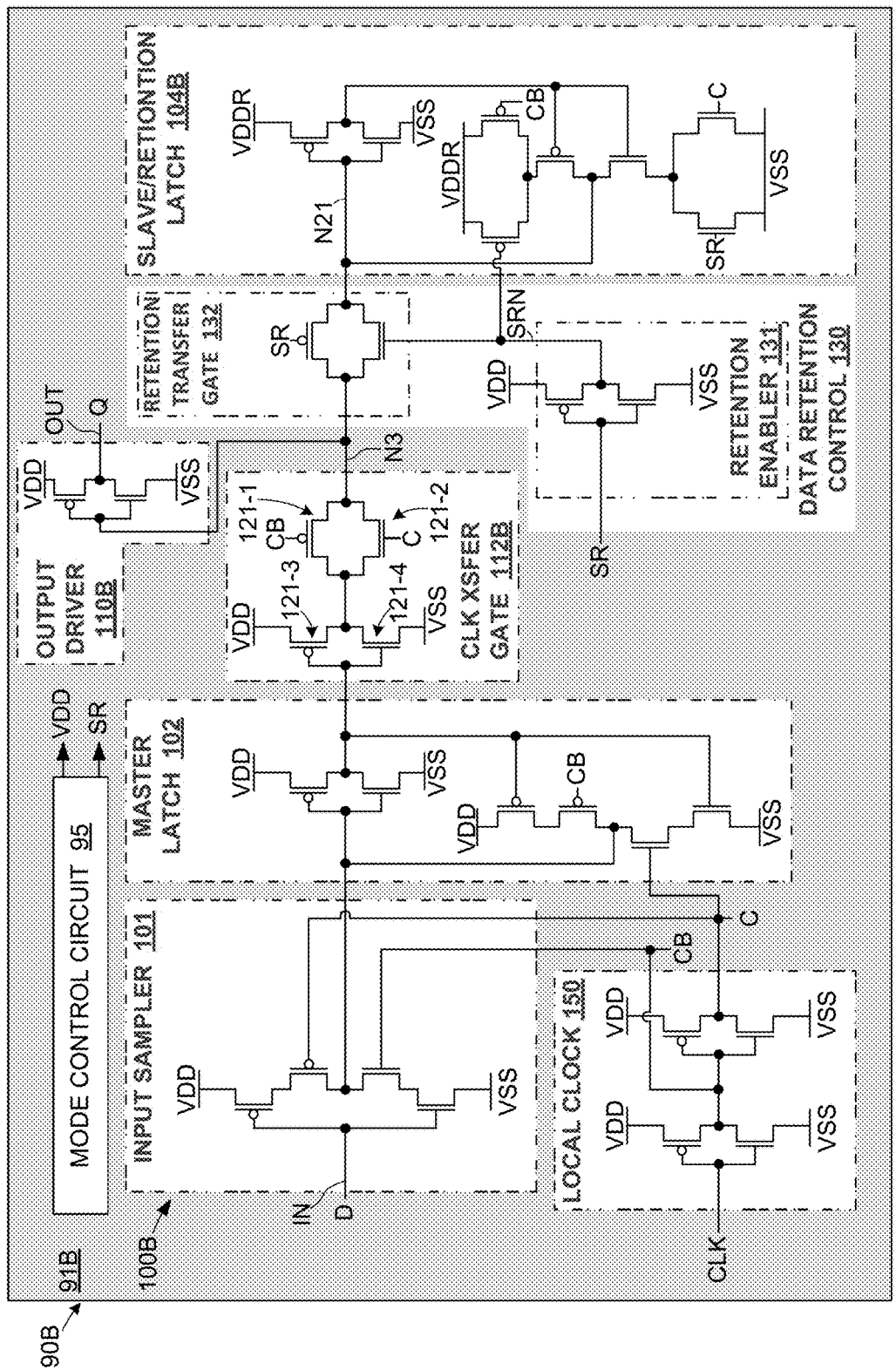
FIG. 4 is a circuit diagram showing a partial IC including a retention flip-flop configured in accordance with a second exemplary embodiment of the present invention.

FIG. 4 shows a simplified integrated circuit 90B (Topology D) that is fabricated on a semiconductor substrate 91B using known semiconductor processing techniques, and generally includes a retention flip-flop (volatile latch circuit) 100B and mode control circuit 95. Mode control circuit 95 and input sampler sub-circuit 101, master latch sub-circuit 102, and local clock sub-circuit 150 of retention flip-flop 100B are all configured to function substantially as described above with reference to flip-flop 100A, and therefore detailed descriptions of these circuits are omitted below for brevity. In addition, it is understood that integrated circuit 90B includes power domains and other circuitry that is omitted from FIG. 4 for brevity.

Retention flip-flop 100B differs from flip-flop 100A (topology C) as set forth below. In Topology C, the output driver 110A is fed from feed-forward inverter of slave/retention latch sub-circuit 104A by way of output node N12. In retention flip-flop 100B, the feed-forward inverter of slave/retention latch sub-circuit 104B and retention transfer gate sub-circuit 132 are bypassed in the clock-to-output signal path in order to maximize the performance of flip-flop 100B. This is done by moving the input connection which feeds the output driver sub-circuit 110B to node N3 at the output path of clock transfer gate sub-circuit 112B. This change helps in reducing the capacitance loading in the slave/retention latch sub-circuit 104B because output driver sub-circuit 110B is not directly connected to slave/retention latch sub-circuit 104B, as is the case in retention flip-flop 100A. Note that, at the end of the standby/sleep mode, slave/retention latch 104B transmits the stored logic/data value to output driver 110B from input node N21 by way of retention transfer gate 132, which is switched from turned off to turned on when retention control signal SR is de-asserted. To preserve the level of output to be same as the data input, clock transfer gate sub-circuit 112B is configured to include an additional inverter formed by transistors 121-3 and 121-4.

The reduction is capacitance loading in the slave/retention latch sub-circuit 104B directly translates to reduction in retention mode power, which is supplied by VDDR. Because slave/retention latch sub-circuit 104B is the only power consumer in retention mode inside the whole circuit, this saves considerable amount of retention mode power compared to flip-flop 100A (Topology C).

Operation of retention flip-flop 100B is similar to that of retention flip-flop 100A (Topology C). The source terminals of the transistors forming slave/retention latch sub-circuit 104B are biased separately from the main supply voltage VDD (i.e., by way of retention supply voltage VDDR), and remain active when neighboring devices and other portions of the circuit are powered down during standby/sleep modes. The local clock sub-circuit 150 functions to turn on and off a clock transfer gate sub-circuit 112B. Retention enabler sub-circuit 131 functions to turn on and off a retention transfer gate sub-circuit 132 in order to isolate the slave/retention latch sub-circuit 104B from the rest of the circuit as well as connect the slave/retention latch sub-circuit 104B with the rest of the circuit, when appropriate. The storage element formed by slave/retention latch sub-circuit 104B is isolated so that undesirable currents do not flow when neighboring devices and sub-circuits are powered down. The transmission gate to slave/retention latch sub-circuit 104B may be driven to a state that guarantees there is high impedance path at the input of slave/retention latch sub-circuit 104B. The voltage level of retention enable signal SR may be conditioned to a known state to ensure that retention transmission gate 132 is at a high impedance during standby/sleep modes. Other operations of retention flip-flop 100B are substantially the same as those described above with reference to retention flip-flop 100A provided above, and are therefore omitted for brevity.

Various modifications may be implemented utilizing techniques known in the art. The VDD potential can be modulated on and off with another device on chip (e.g., mode control circuit 95) or the supply can be provided from off-chip. Similarly, the retention control signal SR can be generated on-chip or off-chip. In one embodiment, the substrate/P-well of the NMOS transistors are connected to a separate VDDR voltage potential, and the VSS potential supplies the source terminals of the NMOS transistors. This allows the voltages VSS and VDDR to be independently modulated to reduce static power during standby or non-operation of host circuit. The sets of transistors in slave/retention latch sub-circuit 104B may have the PMOS source connected to a voltage potential VDDR while Nwell may be connected to a separate voltage potential. The sets of transistors in the other sub-circuits may have PMOS transistors with connections to the Nwell at a VDDR voltage potential and the source terminals at the VDD voltage potential.

As set forth above, main supply voltage VDD may be turned on and off to allow the host IC to operate in different modes of operation such as a normal active mode, a standby/sleep mode, and a shutdown mode. In standby/sleep mode, when most the IC has been powered down, the slave/retention latch portions of each volatile latch circuit formed in accordance with Topologies C and D remain powered to store the logic state stored by that latch. Because the local clock sub-circuit 150 (and the entire clock chain leading from local clock sub-circuit 150 to other circuit structures of the associated power domain) can also be powered down during standby/sleep mode operations in both Topologies C and D, volatile latch circuits formed in accordance with the present invention provide significant power savings over conventional approaches (e.g., Topography B, described above) that require maintaining power to a local clock generator sub-circuit. These circuits provide the opportunity to reduce static power consumption by allowing the modulation of the VDD or VSS or VDDR supply voltages independent of well voltage potential(s). Thus, volatile latch circuits formed in accordance with the present invention allow the preservation of a machine state without the addition of active circuit devices, and allows for tuning circuit performance and power.

Table 1 provides performance, area and leakage values for the various different topologies described herein for comparison purposes. By comparing the various attributes of Topologies C and D in comparison to those of Topologies A and B, Table 1 illustrates that the present invention provides improved volatile latch circuits (e.g., retention flip-flops 110A and 100B) that achieve substantially lower power consumption in both standby/sleep and normal active modes in comparison to conventional flip-flop topologies having comparable or larger chip-area sizes (e.g., Topologies A and B).

TABLE 1

| Topology | Relative Area | Releative Leakage | | Relative Performance |
| --- | --- | --- | --- | --- |
| | | Retention | Normal | |
| A | 100% | 100% | 100% | 100% |
| B | 60% | 201% | 93% | 116% |
| C | 69% | 95% | 82% | 90% |
| D | 74% | 53% | 83% | 104% |

Although illustrative embodiments of the invention have been described in detail herein with reference to the accompanying figures, it is to be understood that the invention is not limited to those precise embodiments. Thus, the scope of the invention is defined by the following claims and their equivalents. For example, specific details associated with the D flip-flop circuit implementations described above are merely provided for exemplary purposes, and novel aspects of the present invention may be utilized in other forms of volatile latch circuits (e.g., scan-D input latches or synchronous and asynchronous set/reset flip-flops). Accordingly, the appended claims are not intended to be limited to specific features of the exemplary embodiments unless otherwise specified.

The invention claimed is:

1. An integrated circuit including at least one power domain sub-circuit that is independently switchable between a normal active operating mode and a standby/sleep operating mode, said integrated circuit also including a mode control circuit configured to transmit a first supply voltage to said at least one power domain sub-circuit and to de-assert a retention enable control signal during said normal active mode, and configured to de-activate the first supply voltage and transmit the retention enable control signal during said standby/sleep mode, said integrated circuit comprising:
 a local clock generator circuit disposed in said power domain and configured to generate a local clock signal in response to a global clock signal;
 a volatile latch circuit disposed in said power domain and configured to sequentially latch logic values passed on an associated signal path during a normal active mode, and to non-volatilely store a last-received said logic value during a standby/sleep mode, said volatile latch circuit including:
  a master latch sub-circuit configured to receive said logic values during first cycles of the local clock signal,
  a slave/retention latch sub-circuit configured to receive said logic values from the master latch sub-circuit during second cycles of the local clock signal, and
  a data retention control circuit coupled between the slave/retention latch sub-circuit and the master latch sub-circuit,
 wherein the local clock circuit and the master latch sub-circuit are operably coupled to the first supply voltage such that the local clock circuit and the master latch sub-circuit are de-activated during the standby/sleep mode, and
 wherein the slave/retention latch sub-circuit is operably coupled to a second supply voltage that remains activated during both the normal active mode and the standby/sleep mode, and is configured such that the slave/retention latch sub-circuit retains said last-received logic value in response to said asserted retention enable control signal during said standby/sleep mode,
wherein the data retention control circuit comprises:
a retention enabler sub-circuit including an inverter coupled to said first supply voltage, and configured to generate an inverted retention control signal in response to said de-asserted retention control signal during said normal active mode; and
a retention transfer gate connected between the master latch sub-circuit and the slave/retention latch sub-circuit and controlled by said retention control signal and said inverted retention control signal such that said retention transfer gate passes said logic values from said master latch sub-circuit to the slave/retention latch sub-circuit during said normal active mode, and such that said retention gate remains turned-off when said retention control signal is asserted, whereby said retention transfer gate is configured to isolate said master latch sub-circuit from the slave/retention latch sub-circuit during said standby/sleep mode.

2. The integrated circuit of claim 1, wherein the volatile latch circuit further comprises an output driver having an input terminal connected to the slave/retention latch sub-circuit such that the slave/retention latch sub-circuit is coupled between the master latch sub-circuit and the output driver.

3. The integrated circuit of claim 1, wherein the volatile latch circuit further comprises an output driver having an input terminal connected to an output terminal of the master latch sub-circuit and to an input terminal of the retention transfer gate.

4. The integrated circuit of claim 1, wherein the slave/retention latch sub-circuit includes a first inverter and a second inverter connected in a cross-coupled arrangement between an input node and an output node, wherein the second inverter comprises:
first and second PMOS transistors connected in parallel to between said second supply voltage and a third PMOS transistor, said first PMOS transistor being controlled by said data retention control circuit and said second PMOS transistor being controlled by said local clock circuit; and
first and second NMOS transistors connected in parallel between a third supply voltage and a third NMOS transistor, said first NMOS transistor being controlled by said retention enable control signal and said second NMOS transistor being controlled by said local clock circuit,
wherein gate terminals of the third PMOS transistor and the third NMOS transistor are connected to the output node,
wherein drain terminals of the third PMOS transistor and the third NMOS transistor are connected to the input node, and
wherein the data retention control circuit is configured such that the first PMOS transistor and the first NMOS transistor remain turned off during said normal active mode, and such that the first PMOS transistor and the first NMOS transistor remain turned on during the standby/sleep mode.

5. The integrated circuit of claim 4, wherein first inverter comprises a pull-up transistor and a pull-down transistor connected in series between the second supply voltage and the third supply voltage,
wherein gate terminals of the pull-up transistor and the pull-down transistor are connected to the input node, and
wherein drain terminals of the pull-up transistor and the pull-down transistor are connected to the output node.

6. The integrated circuit of claim 1, wherein the volatile latch circuit further comprises an input sampler sub-circuit connected between an input node and the master latch sub-circuit, said input sampler sub-circuit comprising an inverter coupled to said first supply voltage.

7. The integrated circuit of claim 1, wherein the volatile latch circuit further comprises an input sampler sub-circuit connected between an input node and the master latch sub-circuit, said input sampler sub-circuit comprising a scan-enable-multiplexer inverter that is controlled by said local clock circuit.

8. The integrated circuit of claim 1, wherein the volatile latch circuit further comprises a clock transfer gate coupled between the master latch sub-circuit and said slave/retention latch sub-circuit.

9. An integrated circuit including a power domain sub-circuit configured to operate in a normal active mode when a first supply voltage is activated and a retention enable control signal is de-asserted, and to operate in a standby/sleep mode when said first supply voltage is de-activated and the retention enable control signal is asserted, the integrated circuit comprising:
a local clock circuit disposed in said power domain sub-circuit and configured to generate a local clock signal in response to a global clock signal; and
a volatile latch circuit disposed in said power domain sub-circuit and configured to receive sequential logic values transmitted on an associated signal path during each said normal active mode, and to retain a last-received said logic value during said standby/sleep mode, said volatile latch circuit comprising:
a master latch sub-circuit configured to receive one of said sequential logic values during first cycles of the local clock signal;
a slave/retention latch sub-circuit configured to receive said sequential logic values from the master latch sub-circuit during second cycles of the local clock signal during said normal active mode; and
a data retention control circuit including:
a retention enabler sub-circuit comprising an inverter operably coupled to said first supply voltage, and configured to assert an inverted retention control signal while said retention control signal is de-asserted, and
a retention transfer gate coupled between the master latch sub-circuit and the slave/retention latch sub-circuit and controlled by at least one of said retention control signal and said inverted retention control signal to remain turned on during said normal active mode such that said logic value is transferable from said master latch sub-circuit through said retention transfer gate to said slave/retention latch sub-circuit, and controlled to remain turn off during said standby/sleep mode,
wherein the slave/retention latch sub-circuit is further configured to retain said last-received logic value in accordance with said retention enable control signal during said standby/sleep mode.

10. The integrated circuit of claim 9, wherein the slave/retention latch sub-circuit includes a first inverter and a second inverter connected in a cross-coupled arrangement between an input node and an output node, wherein the second inverter comprises:
first and second PMOS transistors connected in parallel to between said second supply voltage and a third PMOS transistor, said first PMOS transistor being controlled by said inverted retention enable control signal and said second PMOS transistor being controlled by said local clock circuit; and first and second NMOS transistors connected in parallel between a third supply voltage and a third NMOS transistor, said first NMOS transistor being controlled by said retention enable control signal and said second NMOS transistor being controlled by said local clock circuit, wherein gate terminals of the third PMOS transistor and the third NMOS transistor are connected to the output node, wherein drain terminals of the third PMOS transistor and the third NMOS transistor are connected to the input node, and wherein the data retention control circuit is configured such that the first PMOS transistor and the first NMOS transistor remain turned off during said normal active mode, and such that the first PMOS transistor and the first NMOS transistor remain turned on during the standby/sleep mode.

11. The integrated circuit of claim 10, wherein first inverter comprises a pull-up transistor and a pull-down transistor connected in series between the second supply voltage and the third supply voltage, wherein gate terminals of the pull-up transistor and the pull-down transistor are connected to the input node, and wherein drain terminals of the pull-up transistor and the pull-down transistor are connected to the output node.

12. The integrated circuit of claim 9, wherein the volatile latch circuit further comprises an output driver having an input terminal connected to the slave/retention latch sub-circuit such that the slave/retention latch sub-circuit is coupled between the master latch sub-circuit and the output driver.

13. The integrated circuit of claim 9, wherein the volatile latch circuit further comprises an output driver having an input terminal connected to an output terminal of the master latch sub-circuit and to an input terminal of the retention transfer gate.

14. The integrated circuit of claim 9, wherein the volatile latch circuit further comprises an input sampler sub-circuit connected between an input node and the master latch sub-circuit, said input sampler sub-circuit comprising an inverter coupled to said first supply voltage.

15. The integrated circuit of claim 9, wherein the volatile latch circuit further comprises an input sampler sub-circuit connected between an input node and the master latch sub-circuit, said input sampler sub-circuit comprising a scan-enable-multiplexer inverter that is controlled by said local clock circuit.

16. The integrated circuit of claim 9, wherein the volatile latch circuit further comprises a clock transfer gate coupled between the master latch sub-circuit and said slave/retention latch sub-circuit.

17. An integrated circuit configured to operate in a normal active mode when a first supply voltage is activated and a retention enable control signal is de-asserted, and to operate in a standby/sleep mode when said first supply voltage is de-activated and the retention enable control signal is asserted, the integrated circuit including:

a local clock circuit configured to generate, in response to a global clock signal, a local clock signal and an inverted clock signal, the inverted clock signal having a value that is opposite to said local clock signal, the local clock circuit being operably coupled to the first supply voltage such that the local clock circuit is de-activated during the standby/sleep mode; and a volatile latch circuit configured to receive and store logic values during said normal active mode, and to maintain a stored logic value during said standby/sleep mode, said volatile latch circuit comprising:

a master latch sub-circuit configured to store a received logic value during said normal active mode, the master latch sub-circuit being operably coupled to the first supply voltage such that the master latch sub-circuit is de-activated during the standby/sleep mode;

a slave/retention latch sub-circuit configured to store a copy of the received logic value; and a data retention control circuit including a retention enabler sub-circuit comprising an inverter coupled to said first supply voltage, and configured to generate an inverted retention control signal having a value that is opposite to said retention control signal, wherein the slave/retention latch sub-circuit including a first inverter and a second inverter connected in a cross-coupled arrangement and respectively operably coupled between a second supply voltage and a third voltage supply that remain activated during both the normal active mode and the standby/sleep mode, whereby the first inverter has an input terminal connected to an input node and an output terminal connected to an output node, and the second inverter has an input terminal connected to the output node and an input terminal connected to the input node, and wherein the second inverter includes:

first and second pull-up transistors connected in parallel between said second supply voltage and a third pull-up transistor, said first pull-up transistor being controlled by said inverted retention control signal, and said second pull-up transistor being controlled by said inverted clock signal; and first and second pull-down transistors connected in parallel between said third supply voltage and a third pull-down transistor, said first pull-down transistor being controlled by said retention enable control signal, and said second pull-down transistor being controlled by said local clock signal, wherein gate terminals of the third pull-up transistor and the third pull-down transistor are connected to the output node, and wherein drain terminals of the third pull-up transistor and the third pull-down transistor are connected to the input node.

18. The integrated circuit of claim 17, wherein the volatile latch circuit further comprises an output driver having an input terminal connected to the output node of the slave/retention latch sub-circuit.

19. The integrated circuit of claim 18, wherein the volatile latch circuit further comprises an output driver having an input terminal coupled to a node that is located between an output terminal of the master latch sub-circuit and the input node of the slave/retention latch sub-circuit.

\* \* \* \* \*